United States Patent [19]
Wilhelm

[11] Patent Number: 5,761,033
[45] Date of Patent: Jun. 2, 1998

[54] OPEN COMPUTER SYSTEM WITH EXTERNALLY INTERCONNECTED PERIPHERAL MODULES

[75] Inventor: Joseph R. Wilhelm, Lake Oswego, Oreg.

[73] Assignee: Sejus Corporation, Lake Oswego, Oreg.

[21] Appl. No.: 709,905

[22] Filed: Sep. 9, 1996

Related U.S. Application Data

[63] Continuation of Ser. No. 400,924, Mar. 9, 1995, abandoned, which is a continuation-in-part of Ser. No. 19,855, Feb. 19, 1993, abandoned.

[51] Int. Cl.$^6$ .................................................. G06F 1/16
[52] U.S. Cl. ............................ 361/686; 361/725; 361/803
[58] Field of Search ........................... 364/708.1; 439/59, 439/61; 361/679–686, 724–728, 730, 736, 741, 752, 788, 796, 797, 802, 803

[56] References Cited

U.S. PATENT DOCUMENTS

| | | | |
|---|---|---|---|
| 4,715,385 | 12/1987 | Cudahy et al. | 361/681 X |
| 4,894,792 | 1/1990 | Mitchell et al. | 361/684 |
| 4,899,254 | 2/1990 | Ferchou et al. | 361/685 X |
| 4,964,017 | 10/1990 | Jindrick et al. | 361/683 |
| 5,020,926 | 6/1991 | Wilhelm | 361/685 X |
| 5,041,924 | 8/1991 | Blackborow et al. | 360/69 |
| 5,060,095 | 10/1991 | Rigotti et al. | 360/98.01 |
| 5,065,262 | 11/1991 | Blackborow et al. | 360/75 |
| 5,195,022 | 3/1993 | Hoppal et al. | 361/685 |
| 5,253,129 | 10/1993 | Blackborow et al. | 360/69 |
| 5,297,067 | 3/1994 | Blackborow et al. | 364/708.1 |
| 5,332,306 | 7/1994 | Babb et al. | 361/685 X |

FOREIGN PATENT DOCUMENTS

| | | | |
|---|---|---|---|
| 387749A | 9/1990 | European Pat. Off. | 361/686 |

OTHER PUBLICATIONS

Hewlett Packard Catalog—1992 (pp. 70, 112).
VME VXI Futurebus+ Compatible Products Directory Second Edition 1992 (5 pgs.).

*Primary Examiner*—Michael W. Phillips
*Attorney, Agent, or Firm*—William A. Birdwell & Associates

[57] ABSTRACT

A computer system with an externally accessible bus system having pairs of card slots and bus receptacles for repeatedly installing and removing modules includes one or more peripheral modules containing peripheral devices and having one or more pairs of sliding flanges and a connector for engaging one or more card slot pairs and corresponding bus receptacles. The peripheral modules have a peripheral interface port on an externally accessible front panel for externally connecting the peripheral devices within the module to other modules in the computer system.

8 Claims, 17 Drawing Sheets

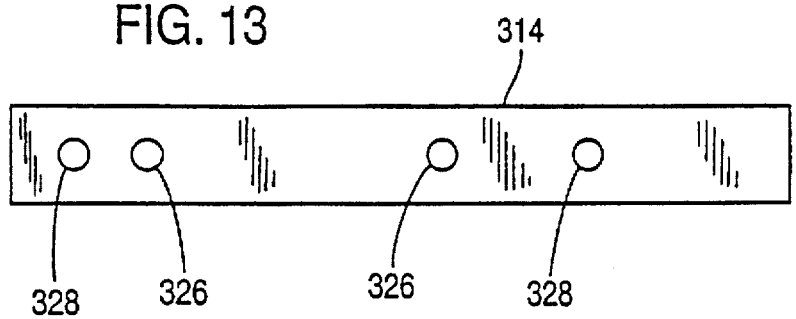
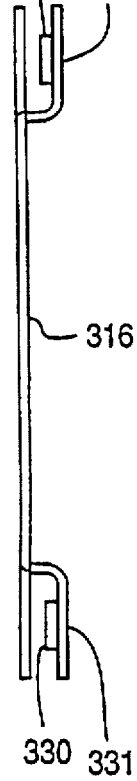
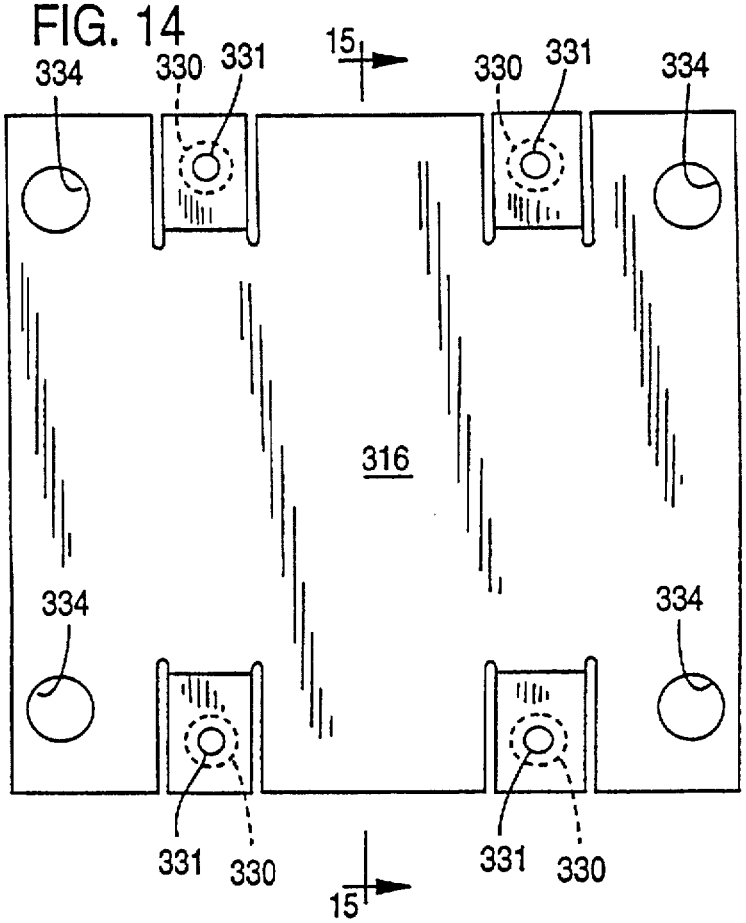
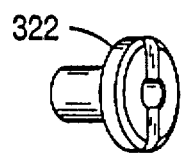
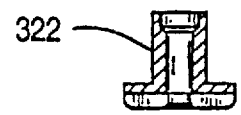
FIG. 13
FIG. 15   FIG. 14
FIG. 16   FIG. 17

OPEN COMPUTER SYSTEM WITH EXTERNALLY INTERCONNECTED PERIPHERAL MODULES

This is a continuation of application Ser. No. 08/400,924, filed on Mar. 9, 1995, now abandoned which is a continuation-in-part of application Ser. No. 08/019,855, hereby incorporated by reference in its entirety.

BACKGROUND OF THE INVENTION

1. Field of the Invention

The present invention relates generally to computer add-on devices and, more particularly, to easily and repeatedly installable, removable, modular peripheral devices and displays for use with a computer having a bus system accessible through an aperture in the computer housing.

2. Description of Related Art

Most modern computers include an internal bus having a plurality of multisignal receptacles for insertion of various add-on circuit cards having conductive edge or connector terminals. Add-on or plug-in circuit cards provide the computer with such features as additional memory, IEEE 488 interface, a modem interface, and extra serial or parallel I/O ports. A computer system which accepts add-on or plug-in accessories is referred to herein as an open computer system.

Many computers include a housing defined above a substantially flat base having an upwardly-extending back wall and front wall and below a removable cover comprised of a top wall having two downwardly-extending side walls. An example of such a computer is any one of the so-called PC compatibles found in nearly any office. The base of such a computer supports the multisignal receptacles, add-on cards, and other components, such as a power supply, floppy disks, hard disks, etc., within the interior of the housing.

In the past several years, mass storage devices, such as hard disks, have become commonplace as both original and add-on equipment for computers of all types. A hard disk, used to store and retrieve large quantities of digital information, is generally comprised of a plurality of record-like platters having a magnetic coating and a plurality of read/write heads for reading and writing digital information on the platters. External contaminants such as smoke and dust can destroy a hard disk because the read/write heads float extremely near to the platter surfaces being rotated at high speed. Because of this concern, hard disks are provided in hermetically sealed canisters that include the necessary electronics and interface connections to allow external control of hard disk operations.

A controller card is also needed to operate a hard disk. The controller card provides an electronic interface between the computer bus system and the hard disk in one of five common disk interface types: IDE; ESDI (Enhanced Small Device Interface); SCSI (Small Computer System Interface); ST-506; and ST-412. In general, the controller card is an add-on circuit card that plugs into the bus system and is therefore physically separate from the hard disk. Power and I/O cabling are provided between the controller card and the remote hard disk, which may be located inside or outside of the computer housing.

In a conventional computer having an internal bus system, the installation of a hard disk and controller card is relatively permanent and is a labor intensive and time consuming process. Installation typically requires removal and replacement of the cover and the numerous fasteners that attach the cover to the base. With the cover off, the controller card is installed by pressing its edge connector into an empty multisignal receptacle (a "slot"), the hard disk is mounted onto or adjacent the base with screws or straps, or both, and the necessary power and I/O cabling is connected between the controller card and the hard disk. The cover and fasteners are then replaced.

Many companies must take security precautions with information considered to be proprietary or vital to national security. Such information can, of course, be stored in various types of computer storage media, including hard disks, floppy disks, and tape drives. With floppy disks and tape drives, the storage medium may be easily removed and secured when not in use. However, the same removal process is not possible with the just-described conventional hard disks, since they are permanently mounted in the interior of the computer housing. Because of the generally fixed nature of hard disks, sensitive information is frequently stored on removable floppy disks, while other non-sensitive information is stored on the hard disk. This is very inefficient. Also, floppy disks have limited storage capacity and their access speed and transfer rate are very slow relative to hard disks.

One approach to simplifying the task of hard disk installation is set forth in U.S. Pat. No. 4,639,863, issued to Harrison et al. on Jan. 27, 1987. Harrison et al. offer an add-on circuit card that contains both a controller and a hard disk. Although the apparatus of the '863 Patent simplifies and speeds up the installation of a hard disk in a computer having an internal bus system, it is not designed for nor is it suitable for day-to-day removal and replacement. In particular, the apparatus of the '863 Patent is undesirable for removal and replacement because the user must remove and replace the computer cover to gain access to the card, and because the controller circuitry is exposed and subject to static damage if handled.

Other removable media devices are available, such as those that utilize the 5¼-inch peripheral bay. The SyQuest Model SQ555 is an example of such a device. The limitation of all such devices that utilize a 5¼-inch mounting bay is that they require significant disassembly of the typical computer system for installation. Another limitation of these particular devices is storage capacity. Typical removable cartridge capacity is about 44–128 Mbytes as compared to a Gbyte or more for hard disks.

Some computer manufacturers, such as HEWLETT-PACKARD, offer a computer having an enclosure wherein the multisignal receptacles of a bus system are accessible through an aperture provided in an exterior wall of the enclosure. The present inventor calls this type of bus system an externally accessible bus system because add-on circuit cards may be inserted and removed from the interior of the computer without having to remove a cover or disassemble the computer to any extent.

In a computer having such an externally accessible bus system, the standard hard disk is conventionally mounted permanently inside of the computer housing. This arrangement is undesirable because an internal, permanently mounted hard disk is difficult and time consuming to install and obviously not readily removable. Upgrading, replacing, or removing (e.g., for security) such a device is an impractical and laborious task.

Free standing external hard disks may also be connected to such a computer system. With an external hard disk, an interface card (e.g., a SCSI card) is installed in the externally accessible bus system and a cable is connected between the external hard disk and I/O signals on the interface card. The free standing external hard disks are undesirable as well, because such devices typically require a substantial amount of desk space or rack space if the computer is in a rack and are usually too bulky and cumbersome to be readily placed in a safe for secure keeping.

In typical externally accessible bus systems, modular add-on devices (modules) are interconnected internally for inter-module communication using the system bus. Usually the communication takes place on the primary addressing and data lines of the system bus. Communication between modules on the system bus, however, is disadvantageous because system bus resources including bus lines, signaling time, bus control, etc. are consumed that could otherwise be used for other purposes. Signals exchanged between modules on the system bus must also adhere to the standards of the system bus for pin assignment, timing, handshaking, and other signaling requirements. This can cause incompatibility problems for peripherals designed to communicate according to another interfacing standard.

Typical of externally accessible bus systems are VXIbus standard systems. (VXIbus is a modular computer and instrumentation standard using an externally accessible bus system.) VXIbus systems use a passive backplane architecture, meaning that all active electronics including the computer's central processing unit (CPU) are located in modules that plug into multisignal receptacles on a circuit board (the passive backplane) in the back of the enclosure which supports bus lines for interconnecting the multisignal receptacles, but no active circuitry other than possibly signal conditioning circuitry.

Generally, one of the modules in a VXIbus system is a system bus controller module which includes either an embedded CPU or an external I/O port on a front panel for connecting and interfacing an external host computer to the system bus. Because of module size constraints, system bus controller modules are limited in the number of devices they can contain. Additional peripheral devices needed by the system bus controller module such as mass storage devices, printers, modems, and the like are provided in separate peripheral modules which plug into the passive backplane and communicate with a controller module on the system bus. This has the disadvantages noted above of consuming system bus resources and requiring communication with the peripheral module to adhere to the signaling requirements of the system bus.

In order to provide an interface for inter-module communication separate from their primary data and address bus lines, VXIbus systems provide a subsystem bus or local bus which is a subset of the bus lines in the system bus specifically dedicated to inter-module communication. This local bus is configured in a daisy chain structure to allow inter-module communication between a set of modules installed in adjacent slots. However, such a local bus scheme only serves to free the primary communication lines of the system bus without solving the problems typically associated with inter-module system bus communication. Inter-module communication on the local bus still consumes system bus resources and must be done according to local bus signaling requirements. Also, the scheme reduces system flexibility in requiring the modules to be located in adjacent slots.

An alternative used by some manufacturers to system bus communication between modules is an internal connection between two adjacent modules. The electronic circuitry of two modules is electrically interconnected with cables or wires. This must be done prior to installation because the electronic circuitry of the modules is not externally accessible after installation. The modules must then be installed in adjacent slots in the system. The wiring between the modules would otherwise prevent installation of another module in any slot between the interconnected modules. Therefore, system flexibility and ease of installation are reduced when this alternative is used.

A further alternative is to provide a separately housed or stand alone, external peripheral device which can be connected to the system bus controller module or other module requiring access to the device using a peripheral interface port on the front panel of the system bus controller module. Such separately housed, external peripheral devices are undesirable, however, because of the additional desk, rack, or work space they consume.

Ordinarily, computer systems are used with some type of visual display device, such as a cathode ray tube (CRT) or flat panel display. In rack or console mounted, open computer systems, such displays have previously required an inordinate amount of front panel area. Where the display is built into the open computer system it greatly reduces the number of module slots that can be provided. Where the display is provided in a separate rack or console mounted enclosure, it greatly reduces the amount of space available for other equipment. It would be desirable to provide a visual display device that is large enough for comfortable viewing, yet does not greatly reduce the amount of equipment space.

SUMMARY OF THE INVENTION

In recognition of the need for an easily installable, repeatedly removable mass storage device for use in a computer having a computer housing and an externally-accessible accessory aperture on the computer housing in which accessory aperture are located a plurality of multisignal bus receptacles and a corresponding plurality of card slots on either side of each receptacle, one embodiment of the present invention is comprised of a rotating fixed disk provided in a sealed disk housing; a circuit board supporting electronic circuitry for controlling the operation of the rotating fixed disk, the circuit board comprising an electrical connection means for electrically connecting the circuit board to one of the bus receptacles and a first pair of opposed elongate extensions for sliding engagement with a first one of said card slots; electrical connection means for connecting the circuit board with the rotating fixed disk; a substantially enclosed housing having a second pair of opposed elongate extensions for sliding engagement with a second one of said card slots; means for mounting said rotating fixed disk within said substantially enclosed housing; means for mounting said circuit board within said substantially enclosed housing; first means for exposing said first pair of opposed elongate extension of said circuit board to said first one of said card slots outside of said substantially enclosed housing; and second means for exposing said electrical connection means to said one of the bus receptacles outside of said substantially enclosed housing; whereby rapid and repeated installation and removal of said self-contained mass storage device, both mechanical and electrical, is possible.

In recognition of the need for non-system bus connected peripheral devices in externally accessible bus computer systems, another embodiment of the present invention provides an externally accessible bus computer system having a peripheral module containing one or more peripheral devices which are externally connectable to other modules in the system. External connection to another module is accomplished with a peripheral interface port on a front panel of the peripheral module which is externally accessible when the peripheral module is installed in the computer system. The peripheral module's peripheral interface port is connectable to a peripheral interface port on another module installed in the computer system such as a system bus controller module to provide inter-module communication.

As a visual display device, the present invention provides a storable flat panel display that is integrated into a module, or is included as a rack or console mounted accessory that utilizes minimal space. In the integration case, the display can be stored vertically in a module that fits into a slot of an open computer system. The display slides out of the module and folds to the left or the right, over other modules, for use. The display may also be pivoted about a horizontal axis once it pulled out of the module.

In the accessory case, the flat panel display can be separately packaged for rack or console mounting. It is horizontally stored. In one embodiment, the display slides out and folds up or down over other rack mounted devices. In another embodiment, the display mounts in a drawer which slides out of an enclosure, and the display pops up out of the drawer. Once it has popped up, the display can be rotated about a vertical axis.

In addition, a computer housing is provided which is adapted for mounting in an enclosure in an orientation 90 degrees horizontally from the customary orientation and which includes an integrated display disposed on the side thereof facing out of the enclosure. Preferably, the housing is adapted to slide out of and into such enclosure so that modules may be conveniently inserted into and removed from the housing.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

FIG. 13 is a top view of an adapter plate of a shock and vibration absorbing suspension system for mounting a peripheral device in the peripheral module of FIG. 6;

FIG. 14 is a top view of a mounting plate of a shock and vibration absorbing suspension system for mounting a peripheral device in the peripheral module of FIG. 6;

FIG. 15 is a side view of the mounting plate of FIG. 14;

FIG. 16 is a peripheral view of a shoulder nut of a shock and vibration absorbing suspension system for mounting a peripheral device in the peripheral module of FIG. 6; and FIG. 17 is a side sectional view of the shoulder nut of FIG. 16.

DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide an easily installable, repeatedly removable integrated hard disk and controller.

Figure 1:
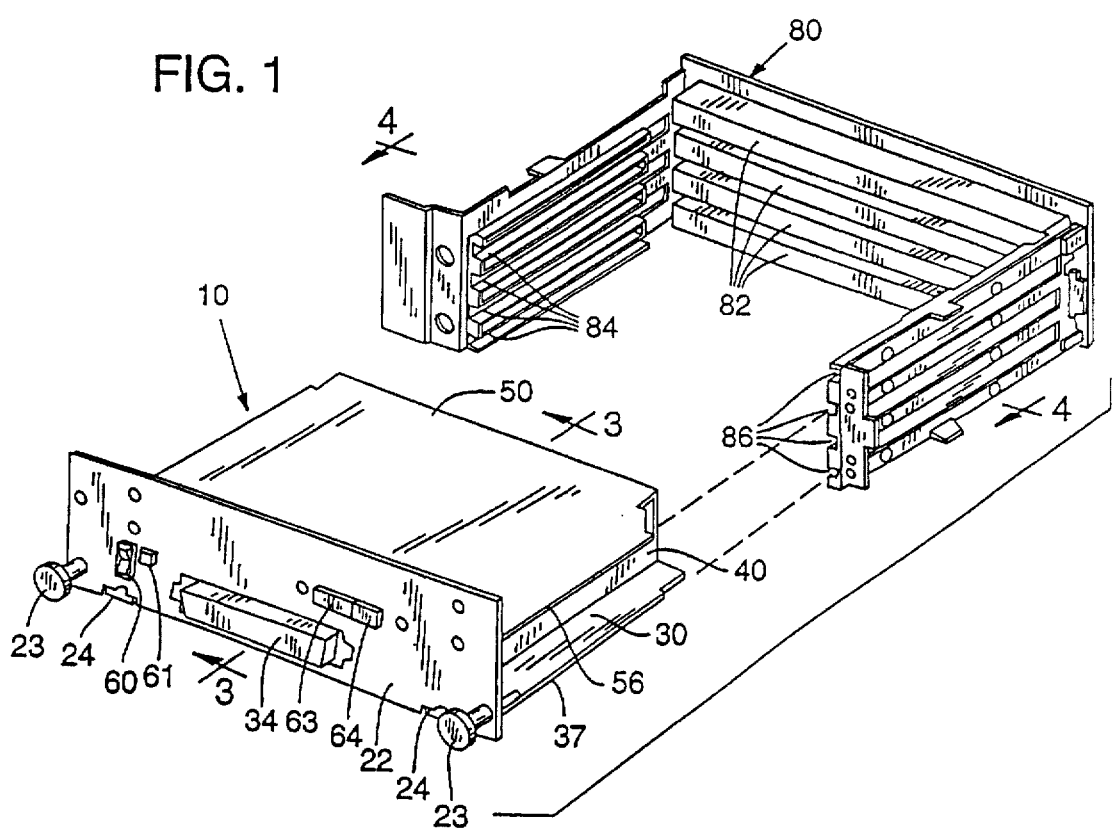
FIG. 1 is a perspective view of an easily installable, repeatedly removable mass storage device according to one embodiment of the present invention and a typical receptacle chassis into which it may be removably plugged.
Figure 2:
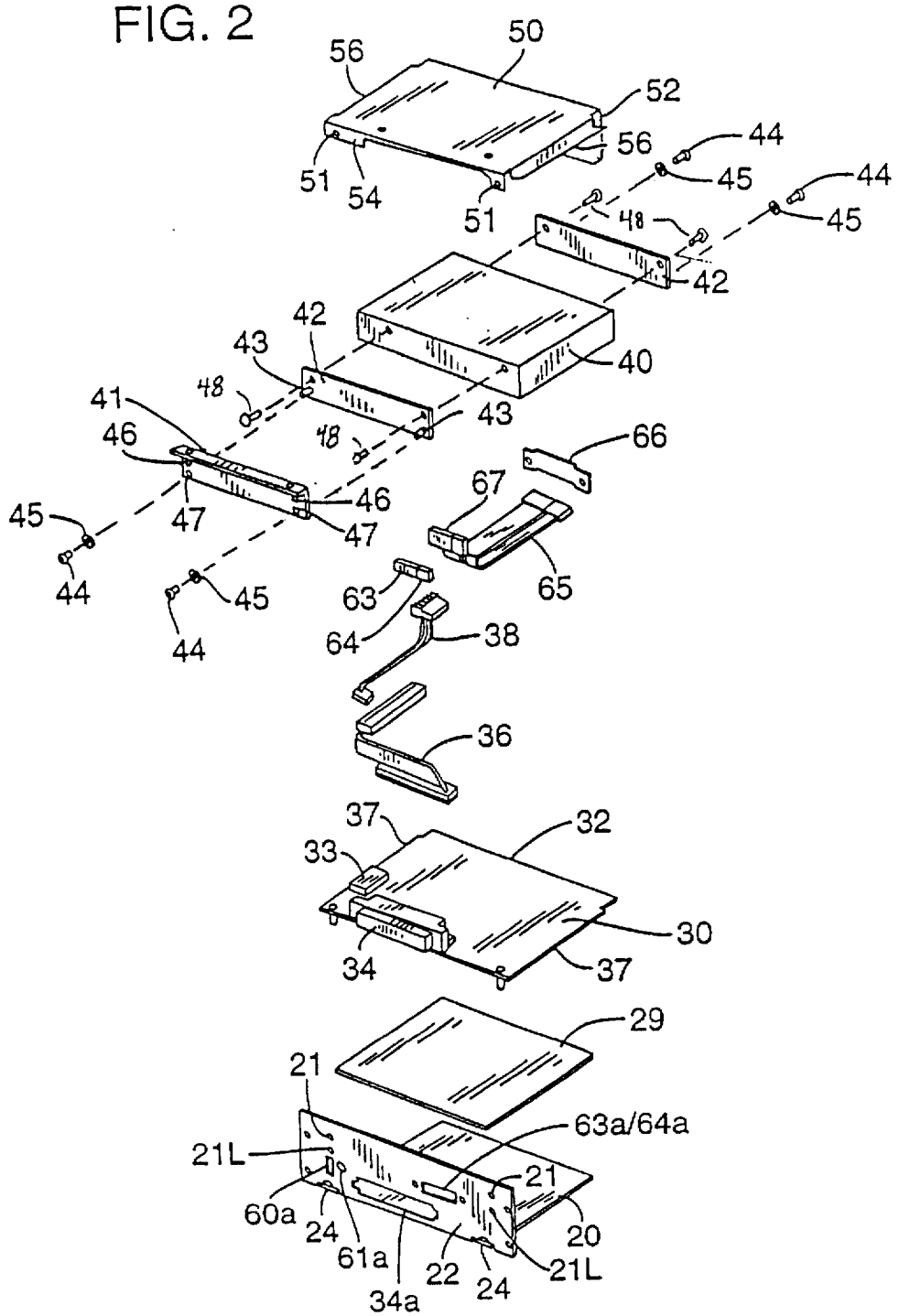
FIG. 2 is an exploded perspective view of the easily installable, repeatedly removable mass storage device of FIG. 1.

An integrated hard disk module 10 and an exemplary externally accessible bus system chassis 80 are shown in FIG. 1. The bus system chassis 80 is like that found in the HEWLETT-PACKARD 9000 Series 300 family of computers. As shown, the bus system chassis 80 is comprised of a plurality of back plane connectors or multisignal receptacles 82 and a corresponding plurality of paired horizontally-opposed slots 84, 86. In the HEWLETT-PACKARD computers, the bus system chassis 80 is installed such that the slots 84, 86 are accessible through an aperture in an exterior wall of the computer housing (not shown). In this arrangement, various add-on circuit cards can be inserted and removed from the back plane connectors 82 without need to disassemble the computer.

The integrated hard disk module 10 of FIG. 1 is a self-contained mass storage device that may be easily inserted and removed from the bus system chassis 80. As shown in FIGS. 1 to 4, the hard disk module 10 is comprised of a controller card 30 and a hard disk 40 mounted in a protective housing comprised of a base plate 20, a front plate 22, a lid 50, and a back plate 52. The just-mentioned components of the protective housing are preferably formed from sheet metal, but any other suitable material may be used.

In the preferred embodiment, the base plate 20 and the front plate 22 are integrally formed from a single sheet. The front plate 22 extends perpendicularly from the base plate 20 and contains a plurality of apertures 34a, 60a, 61a, and 63a/64a for carrying various connectors, configuration switches, or indicators.

As shown in FIG. 1, the front plate 22 carries an address selection switch 60 for allowing external selection of a SCSI address for the hard disk; a hard disk activity indicator 61 such as an LED; a first parameter switch 63 for setting parameters for the SCSI host adaptor such as the select code and interrupt level; a second parameter switch 64 for setting a SCSI address and a parity selection parameter; and a SCSI I/O connector 34.

Figure 3:
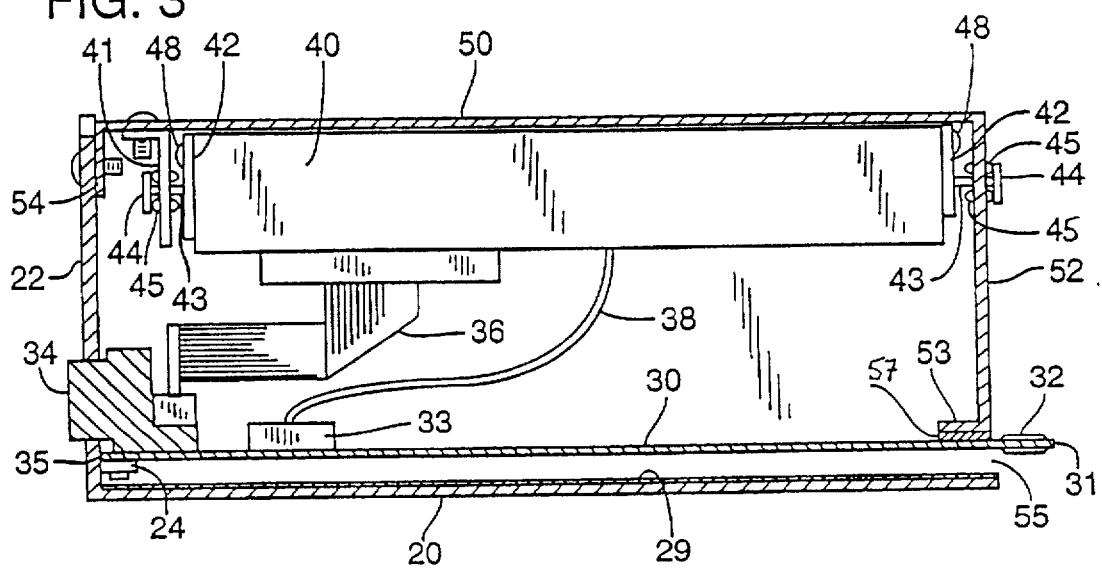
FIG. 3 is a cross-sectional view of the easily installable, repeatedly removable mass storage device of FIG. 1 taken along section lines 3—3.

As best shown in FIG. 3, the front plate 22 is further comprised of a pair of support tabs 24 that are bent back from the front plate 22 so as to extend parallel to and horizontally above the base plate 20. The controller card 30 is rigidly fastened to the support tabs 24 with any desirable fastening means such as sheet metal screws. To prevent shorting, an insulating sheet 29 is located below the controller card 30 on the top side of the base plate 20.

The controller card 30 is preferably an intelligent (SCSI) interface/controller card comprised of a central portion and a pair of slide wings 37 on a left and right side thereof for sliding engagement with one of the paired slots 84, 86 of the bus system chassis 80. An electrical connector means such as an edge connector 32 with a plurality of conductive areas is formed on a back edge 31 of the controller card 30. The edge connector 32 fits into and electrically interconnects with any one of the multisignal receptacles 82 of the bus system chassis 80. Other electrical connection means such as plug jacks housing conductive connectors are, of course, possible.

The preferred controller card 30 includes a power connector 33 for providing operating power to the hard disk 40 via a power cable 38. A data cable 36 provides data interconnection between the card and the hard disk 40. As the preferred controller card 30 is an intelligent (SCSI) interface/controller card, a SCSI I/O connector 34 is provided on a front edge 35 of the controller card 30 and protrudes through a corresponding one of the apertures 34a carried by the front plate 22.

The first and second parameter switches 63, 64 are electrically connected to the controller card with a ribbon cable 65. A plate 66 is provided to retain an end 67 of the ribbon cable and the parameter switches 63, 64 in the aperture 63a/64a of the front plate 22.

Figure 4:
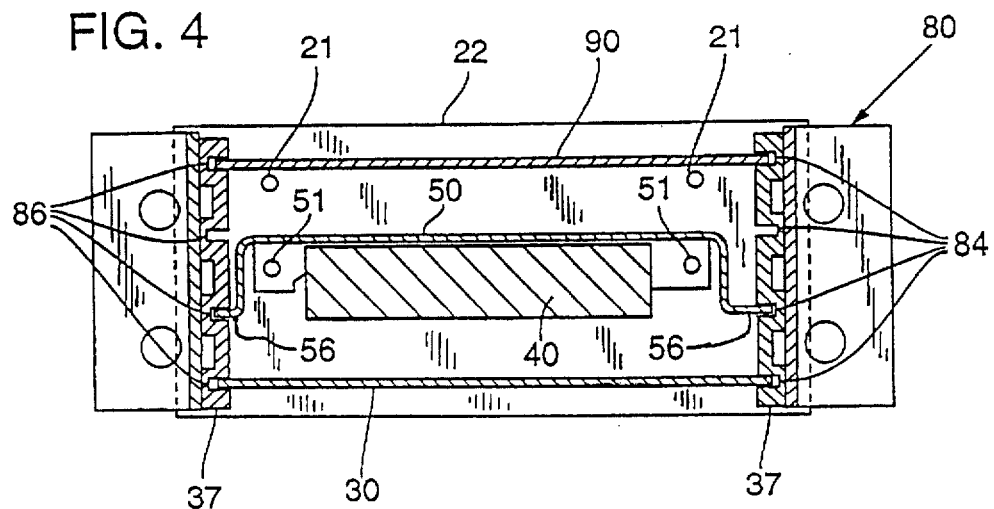
FIG. 4 is a cross-sectional view of the easily installable, repeatedly removable mass storage device of FIG. 1 taken along section lines 4—4, and showing an add-on card 90 installed above the device.

The lid 50 is comprised of a back plate 52, a front mounting plate 54, and a pair of slide wings 56. The front mounting plate 54 includes a pair of apertures 51 for fastening the lid 50 to one of a corresponding pair of upper apertures 21 or lower apertures 21L in the front plate 22. The upper and lower apertures 21, 21L are provided to accommodate hard disks 40 of different thicknesses. In the preferred embodiment, the upper apertures 21 are for standard height drives (e.g. a 1.625" thick drive) and the lower apertures 21L are for low profile drives (e.g. a 1" thick drive). As shown in FIG. 4, an add-on card 90 may be accommodated in the upper pair of slots 84, 86, above the lid 50 and behind the front plate 22, when a low profile hard drive 40 is used. If a standard hard drive were used, the lid 50 would be attached to the upper apertures 21 and there would be no space for the add-on card 90.

The hard disk 40 is suspended from an underside of the lid 50 with a shock mount suspension comprised of a pair of disk adapter plates 42, an apertured front shock support 41, a plurality of rubber grommets 45, and a plurality of shoulder nuts 44. In the preferred embodiment, the front shock support 41 is suspended from the lid 50 with sheet metal screws, as shown in FIG. 3. The disk adapter plates 42 are fastened to the left and right sides of the hard disk 40 with fasteners 48, and each includes a pair of outwardly-extending threaded posts 43.

The front shock support 41 includes a pair of upper apertures 46 and lower apertures 47. The back plate 52 serves as a rear shock support, and thus includes apertures corresponding to the upper and lower apertures 46, 47 of the front shock support 41. The threaded posts 43 of the disk adapter plates 42 are arranged to protrude through the lower apertures 47 of the front shock support 41 and the back plate 52. Two upper apertures 46 are provided to accommodate and allow movement of the fasteners 48. A rubber grommet 45 is inserted into each of the lower apertures 47, and then a shoulder nut 44 is pushed through the rubber grommet 45 and turned onto the threaded post 43 of the disk adapter plate 42. In this fashion, the hard disk 40 is elastically suspended from the lid 50 to prevent the hard disk module 10 from being damaged from shock and vibration such as that encountered during operation, removal, replacement, transport, or storage.

The dimension of the back plate 52 is such that a space 55 is defined between a bottom edge 53 and the base plate 20. The space 55 allows the controller card 30 to extend beyond the vertical plane of the back plate 52 such that the back edge 31 and edge connectors 32 may be inserted into one of the multisignal receptacles 82. It has also been found desirable to locate a foam pad 57 between the controller card 30 and the bottom edge 53 of the back plate 52. The foam pad 57 helps to prevent the controller card 30 from being damaged. The foam pad 57 is preferably comprised of a foam strip with an adhesive backing.

Installation of the integrated hard disk module 10 is very simple. The module is simply oriented such that the edge connectors 32 face the back plane connectors 82, and then slid into the bus system chassis 80 by engaging the slide wings 56 of the lid 50 and the slide wings 37 of the controller card 30 with two appropriately spaced pairs of opposed slots 84, 86. The module is then secured with thumb screws 23. Removal for secure storage is equally simple.

Figure 5:
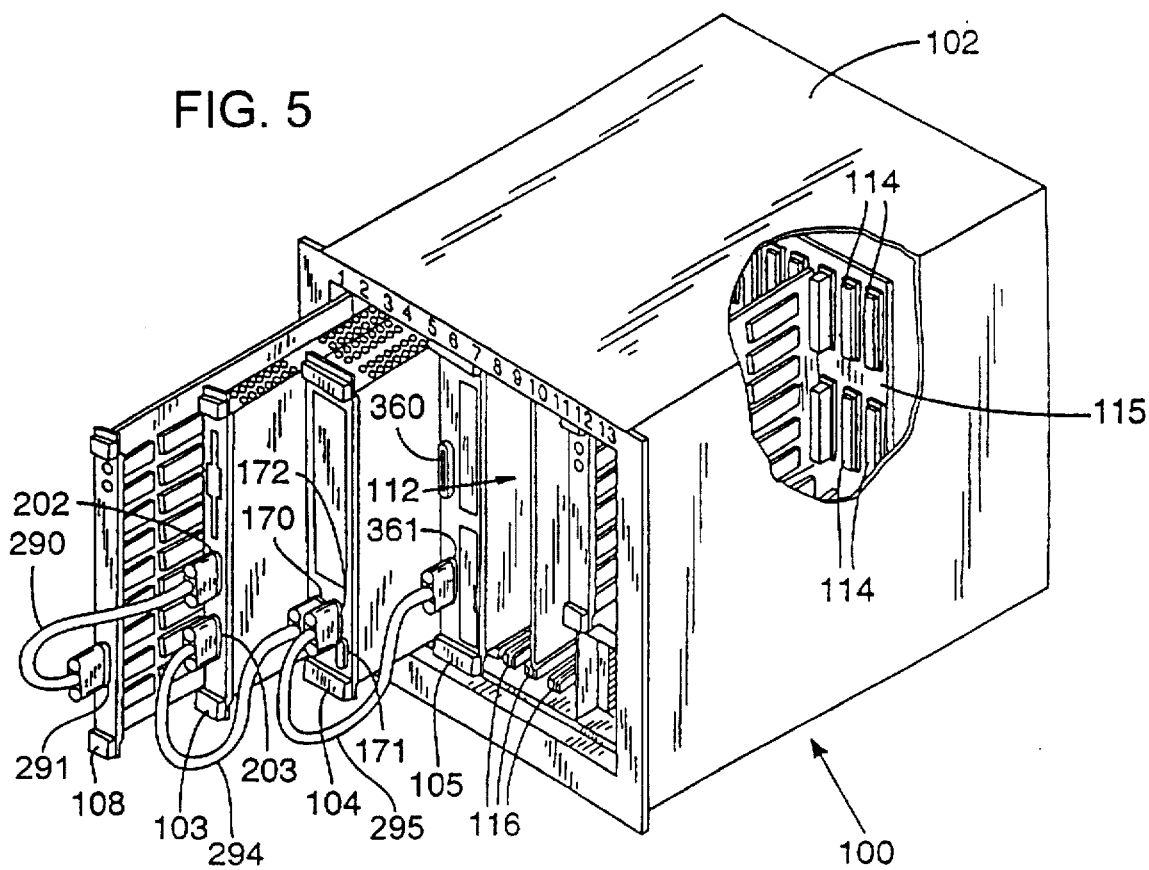
FIG. 5 is a perspective view, partly cut-away, of an open computer system with an externally accessible bus and peripheral modules according to another embodiment of the invention.

With reference to FIG. 5, an open computer system 100 according to another embodiment of the invention comprises a computer chassis 102 and one or more peripheral modules 103–105 which are externally connectable to a system bus controller module 108, to other modules 103–105 or to external devices (not shown). The computer system 100 in the illustrated embodiment conforms to VXIbus standards, but can be otherwise embodied to conform to other industry standards such as Multibus, Futurebus and VMEbus, or to proprietary computer system specifications. The computer chassis 102 has an aperture 112 in an exterior wall thereof, providing external access to multisignal bus receptacles 114 on a backplane 115. In the illustrated VXIbus system, the backplane 115 is a passive backplane providing a plurality of bus lines (not shown) interconnecting the bus receptacles 114. The bus lines and bus receptacles form a system bus for carrying power, address, data, and other signals. In the illustrated system, each bus receptacle 114 comprises a row of one to three connectors. For each of the receptacles 114, a corresponding pair of vertically-opposed card slots 116 are provided in the chassis, one slot to either side of a receptacle. The receptacles 114 and card slot pairs 116 permit repeated insertion and removal of modules, such as modular computer components, including the peripheral and system bus controller modules 103–105, 108.

Referring to FIGS. 6 and 9A–9C, the peripheral module 104 comprises one or more peripheral devices 126, 128 mounted in a substantially enclosed protective housing 130. The housing 130 comprises a base plate 132, a top plate 134, side plates 136, 138, a back plate 140, and a front panel 142. Preferably the various plates 132–142 forming the housing 130 are formed from sheet metal, but any other suitable material can be used. The plates 132–142 are preferably fastened together to form the housing using threaded fasteners 143. The front panel is attached to mounting rails 144, 145 also using threaded fasteners 143. The mounting rails 144, 145 are attached to the base and top plates 132, 134, respectively with threaded fasteners.

Figure 9A:
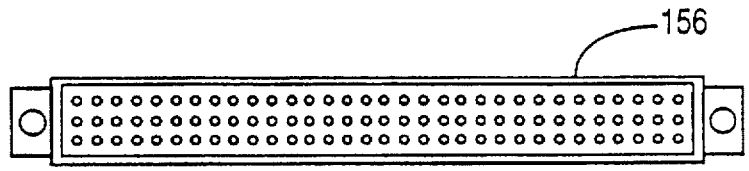
FIG. 9A is an elevation of a bus connector in the peripheral module of FIG. 6.
Figure 9B:
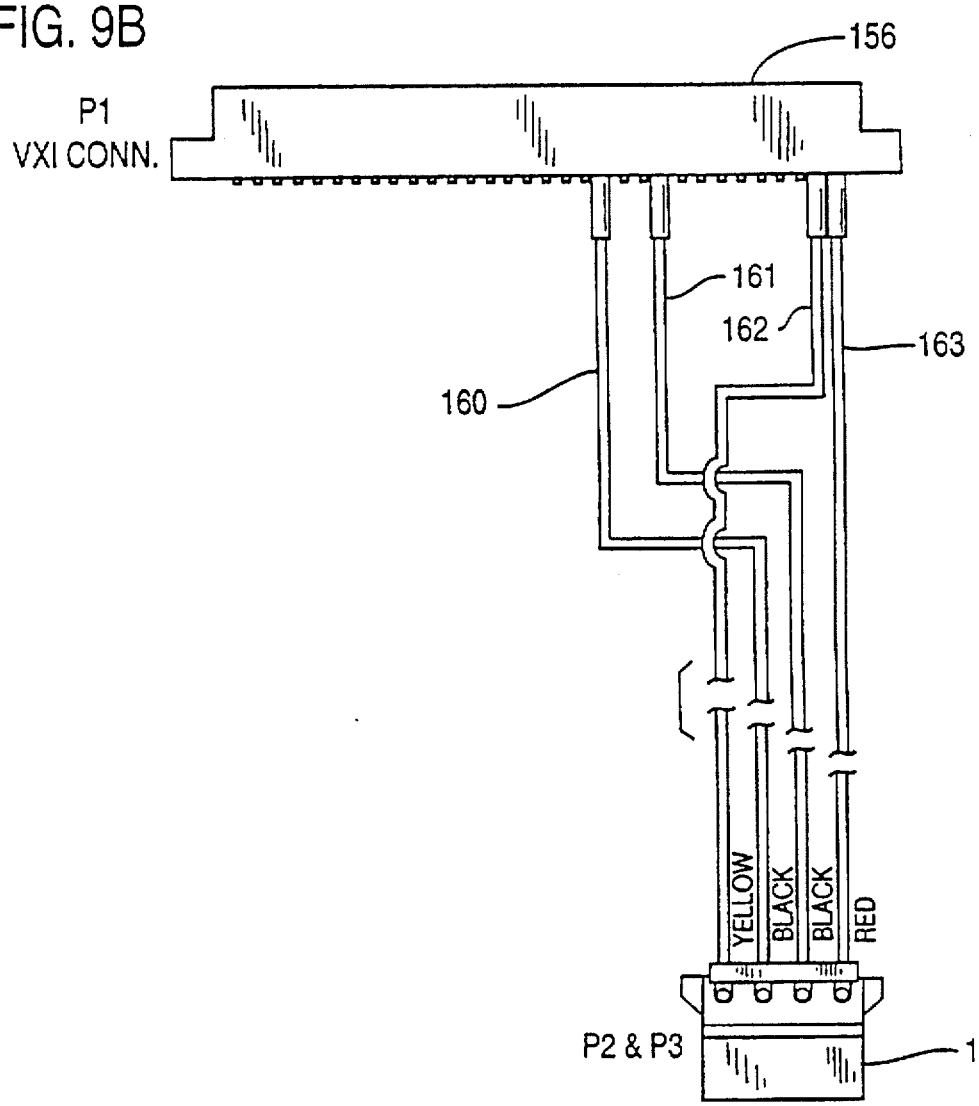
FIG. 9B is a top view of the bus connector of FIG. 9A and a power cable having a power connector.
Figure 9C:
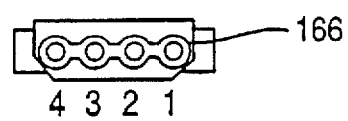
FIG. 9C is an elevation of the power connector of FIG. 9B.
Figure 10A:
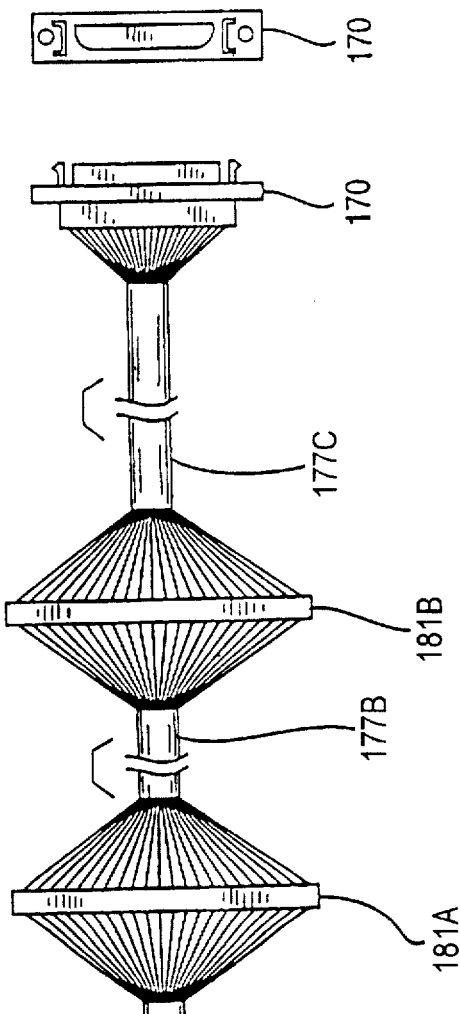
FIG. 10A is an elevation of a first peripheral interface port in the peripheral module of FIG. 6.
Figure 10B:
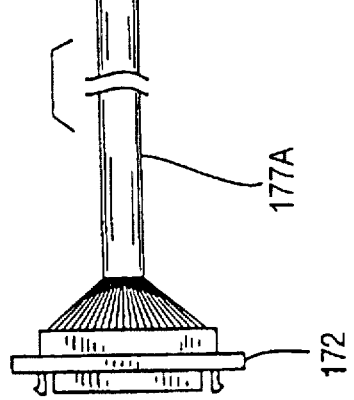
FIG. 10B is a top view of the peripheral interface port of FIG. 10A connected to a SCSI peripheral interface cable having a second peripheral interface port.
Figure 10C:
FIG. 10C is an elevation of the second peripheral interface port of FIG. 10B.
Figure 11A:
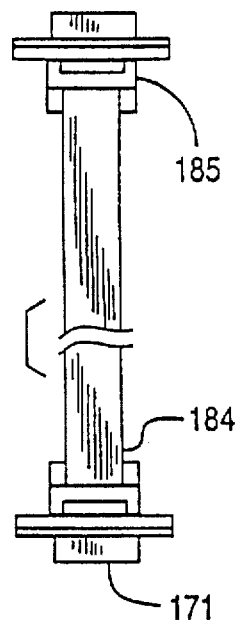
FIG. 11A is a top view of a 9-pin peripheral interface port, cable and peripheral connector in the peripheral module of FIG. 6.
Figure 11B:
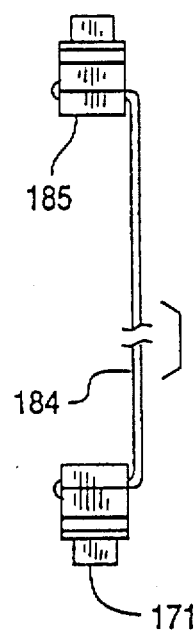
FIG. 11B is an elevation of the 9-pin peripheral interface port of FIG. 11A.
Figure 11C:
FIG. 11C is a side view of the 9-pin peripheral interface port, cable and peripheral connector of FIG. 11A.

Elongated plates 146, 148 having flanges 150–153 along their longitudinal edges are attached, preferably by riveting, welding or other method, to the exterior of the side plates 136, 138, providing elongated extensions for slidingly engaging two adjacent card slot pairs 116 (FIG. 5). It is to be recognized that the flanges 150–153 that engage slot pairs 116 can be formed integrally in the housing 130, without departing from the principles of the invention. Two connectors 156 of the type shown in FIG. 9A and 9B are mounted over or to protrude through rectangular openings 158 in the back plate 140 for engaging adjacent bus receptacles 114 (FIG. 5). The peripheral module 104 is thus easily, repeatedly installable and removable from two adjacent card slot pairs 116 and corresponding bus receptacles 114 of the chassis 102.

The connectors 156 are electrically connected to the peripheral devices 126, 128 within the module 104 to provide power signals from the system bus to the peripheral devices. In the illustrated embodiment, each of the connectors 156 are connected to a peripheral device 126, 128 using wires 160–163 and a power connector 166 which is received in a corresponding connector (not shown) on the peripheral device. When installed in the chassis 102, the connectors 156 engage the bus receptacles 114 to receive power signals from the bus lines on the passive backplane, including ground, +5 volts DC, and +12 volts DC. The power signals are conducted on the wires 160–163 to the peripheral devices, or to power signal conditioning circuitry associated with the devices. Power signal conditioning circuitry is useful, for example, to protect devices from spurious power fluctuations, to prevent propagation of spurious power fluctuations into the system, and to facilitate hot swapping of devices.

With reference to FIGS. 5, 6, 10A–10C and 11A–11C, the peripheral module 104 also provides peripheral interface ports 170–172 mounted in appropriately sized holes 176–180 on the front panel 142. The ports 170, 172 are SCSI I/O connectors while the port 171 is a 9-pin serial I/O connector. SCSI type interface ports 170, 172 are commonly used with mass storage devices while 9-pin serial I/O type ports 171 are commonly used with printer and modem devices. The peripheral interface ports 170–171 are electrically connected to the peripheral devices 126, 128. The SCSI interface ports 170, 172 are connected in daisy chain fashion with cables 177A–C to SCSI type connectors 181A, 181B for engaging matching receptacles in each of the peripheral devices 126, 128. The 9-pin serial I/O port 171 is connected via a cable 184 to a connector 185 for engaging a matching receptacle in one of the peripheral devices.

Figure 6:
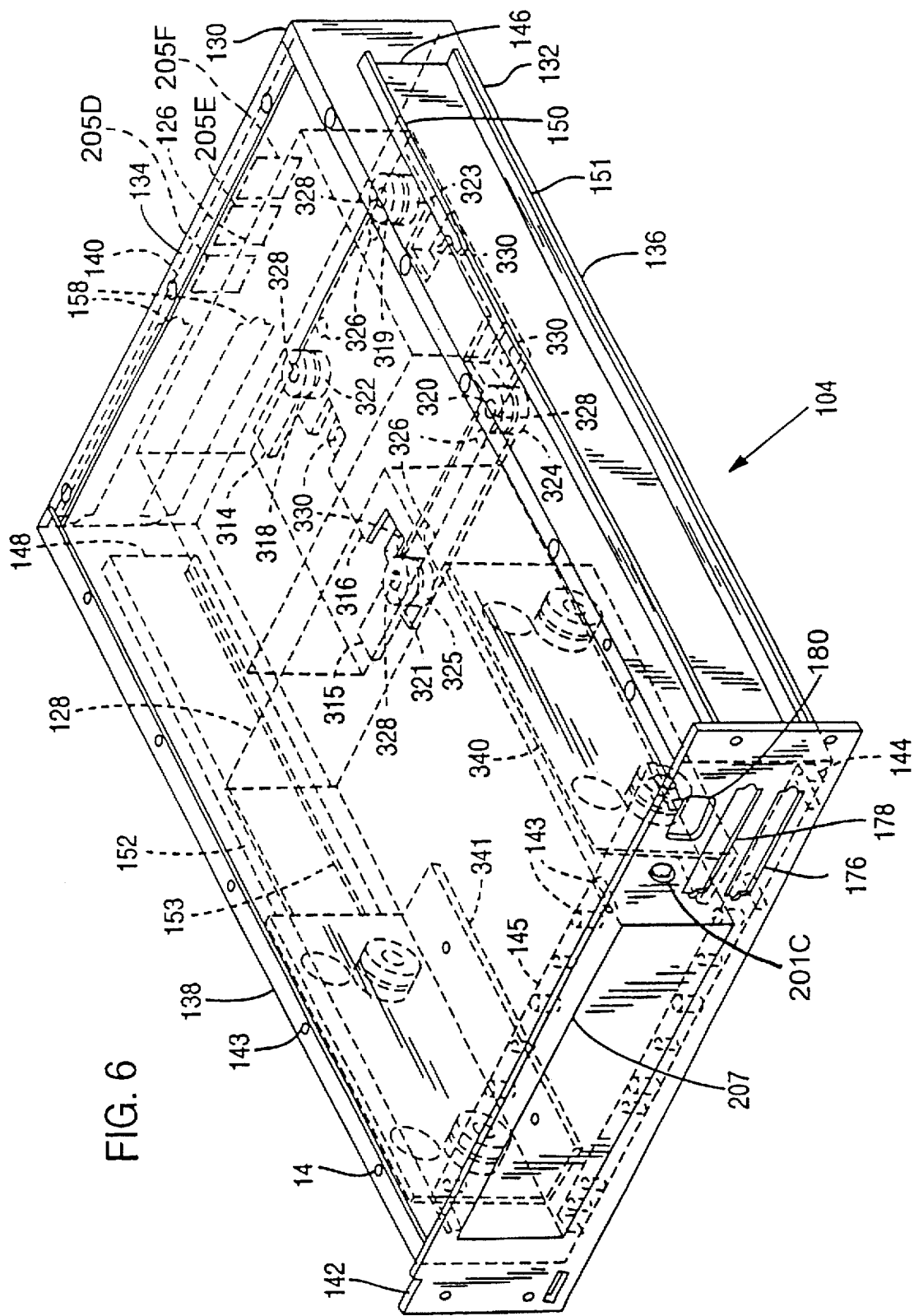
FIG. 6 is a diagram showing a perspective view of one of the peripheral modules in FIG. 5.
Figure 7:
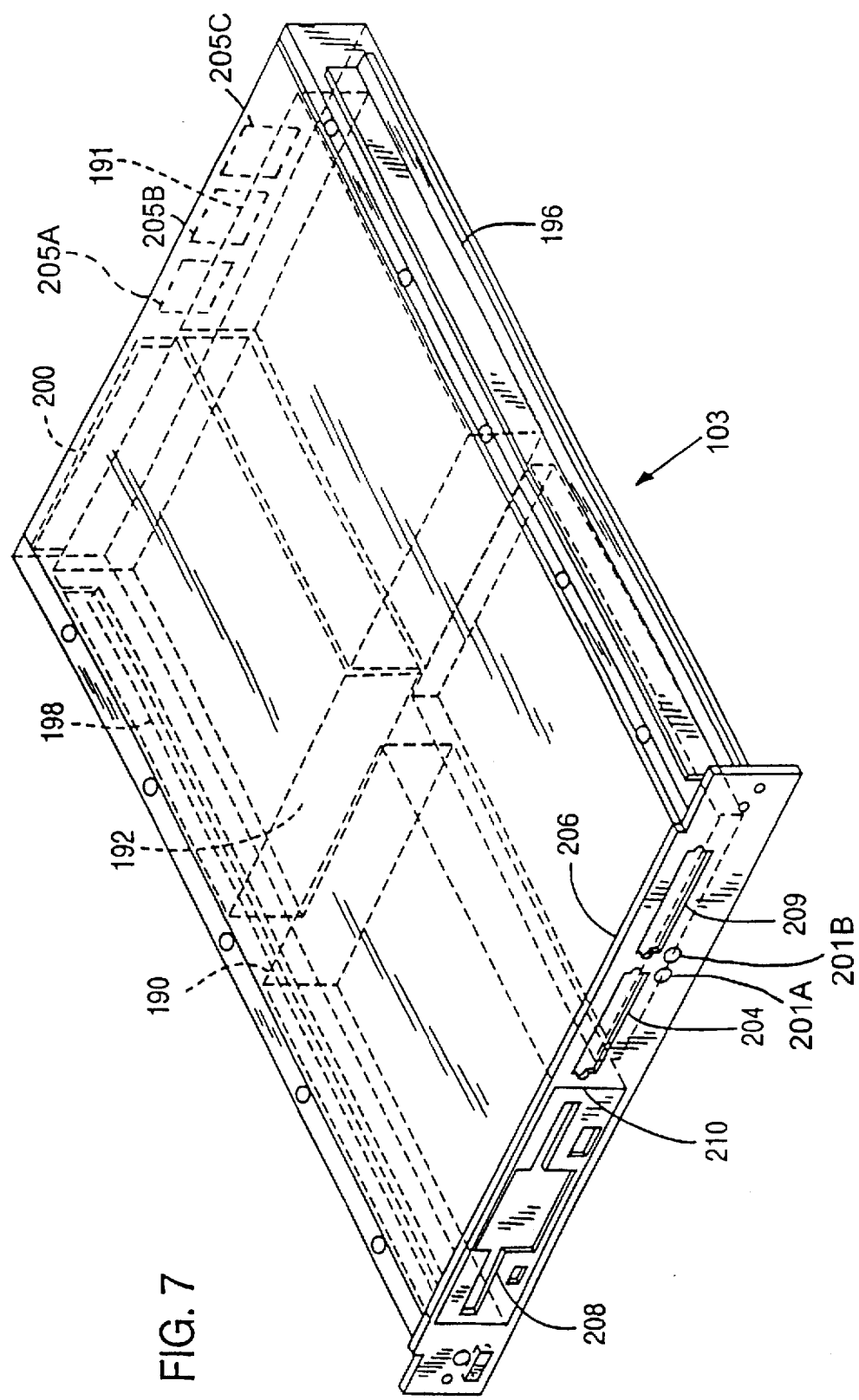
FIG. 7 is a diagram showing a perspective view of another of the peripheral modules in FIG. 5.

Referring to FIG. 7, the peripheral module 103 comprises indicators 201A, 201B, such as LEDs for indicating activity of peripheral devices 191 and 192. For example, the indicators 203 can indicate disk activity if either or both of the devices 191, 192 are hard disk drives. The peripheral module 103 further comprises apertures 205A–C to provide access to device switches (not shown), such as parameter switches for SCSI address and parity selection. Similarly, as shown in FIG. 6, the peripheral module 104 comprises an indicator 201C and apertures 205D–F.

Referring to FIGS. 5 and 7, the peripheral module 104 (FIG. 5) is designed to accommodate peripheral devices 126, 128 such as mass storage and printer devices of standard, normal height (1.625 inch) 3½ inch and 5¼ inch width dimensions. The peripheral module 103 (FIG. 7) is designed to accommodate peripheral devices 190–192 of standard, half height (1 inch) 3½ inch width dimensions. Other embodiments of the invention can include peripheral modules with peripheral devices of other standard and non-standard dimensions. Other embodiments of the invention can also include peripheral modules which accommodate other numbers of peripheral devices, the modules being one or more slots wide.

Since the peripheral module 103 is designed to accommodate only low profile peripheral devices, it can fit in a single card slot pair 116 in the chassis 102. Accordingly, the peripheral module 103 comprises a single pair of elongated flanges 196, 198 for engaging a single card slot pair and only one connector of the same type as the connector 156 shown in FIG. 9 in an opening 200 in its back plate for engaging a single bus receptacle 114. However, in the peripheral module 103, three peripheral devices 190–192 receive power signals from the same connector 156. A multiple drop cable having the four wires 160–163 is therefore used to connect the connector 156 to three power connectors of the same type as the power connector 166, one for each of the peripheral devices 190–192.

Two SCSI type peripheral interface ports 202–203 (FIG. 5) of the same type as the ports 170, 172 shown in FIG. 10 are mounted in appropriately shaped openings 204, 209 in the front panel 206 of the peripheral module 103. The connector 156 and interface ports 170, 172 are connected to the peripheral devices in the peripheral module 103 in the same manner as they are in the peripheral module 104 described above. However, in the peripheral module 103, three SCSI type connectors, one for each of the peripheral devices 190–192, are connected by four lengths of cable in daisy chain fashion to the interface ports 202–203.

Referring now to FIG. 6, the front panel 142 of the peripheral module 104 has a rectangular opening 207 to provide external access to the peripheral device 128. The peripheral device 128 can therefore be of a type requiring external accessibility. Exemplary of peripheral devices requiring external accessibility and suitable for use as the peripheral device 128 are modem devices, printer devices, mass storage devices with removable storage media, and peripheral devices that are themselves removable. Currently available mass storage devices with removable storage media include floppy disk drive devices which record data on removable magnetic disk storage media; tape drive devices which record data on removable magnetic tape storage media, typically in cartridge form; and disk drive devices which record data on removable optical disk storage media. These drive devices for removable storage media generally have an elongated slot 208 (FIG. 7) on their front panel 210 which is accessible through the rectangular opening 207. Removable storage media is inserted and removed from the drive device through the slot 208. It is to be recognized that other mass storage devices having removable storage media, including devices employing other technologies, may be used without departing from the principles of the invention.

Figure 12:
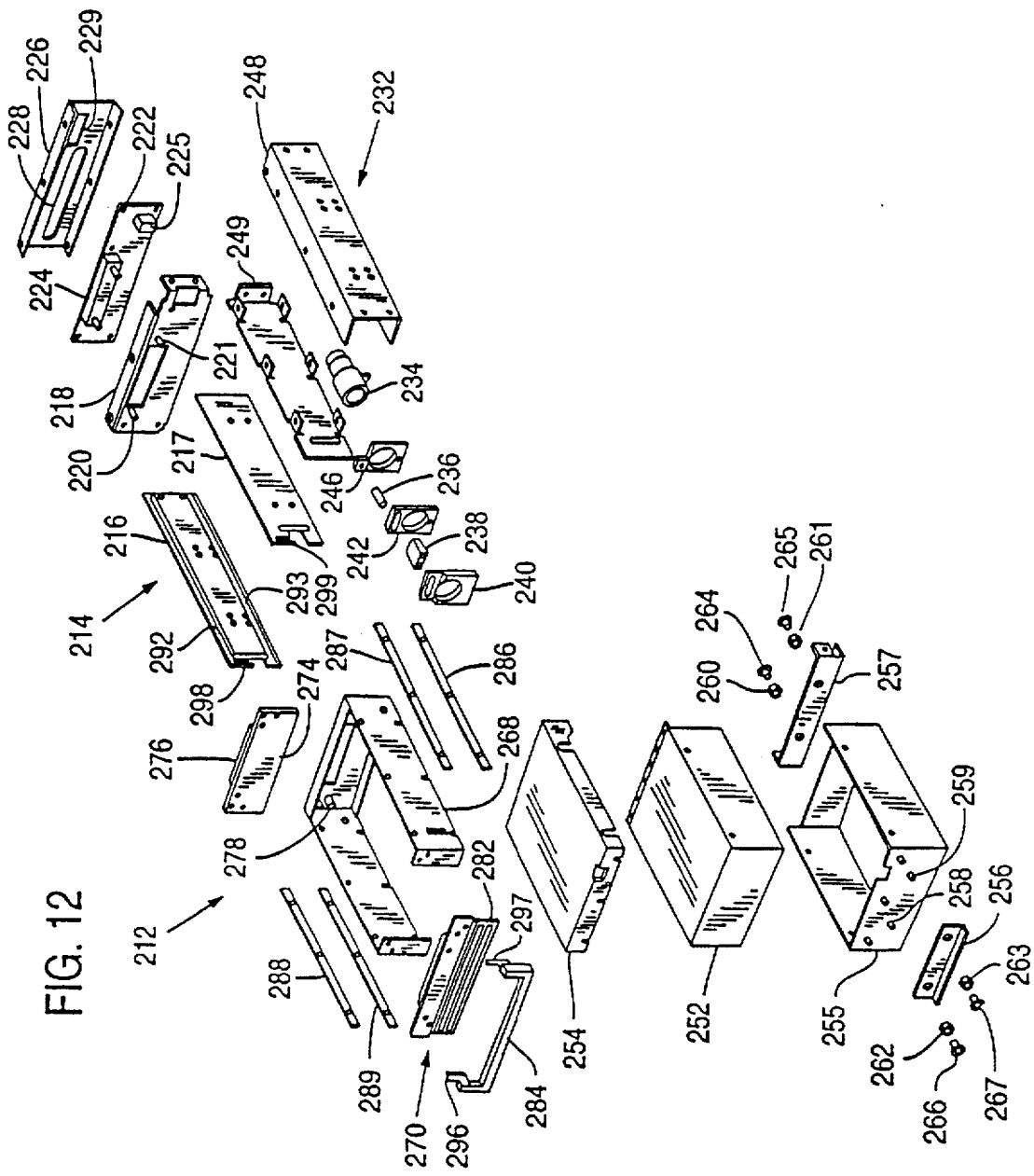
FIG. 12 is an exploded perspective view of a removable hard disk peripheral device useable in the peripheral module of FIG. 6.

The externally accessible peripheral device 128 (FIG. 6) can also be embodied as a conventional, fully removable mass storage device. Referring to FIG. 12, an exemplary removable mass storage device 212 configured for a full height 3½ inch profile drive bay for use as the peripheral device 128 is shown. A docking mechanism 214 comprising slotted left and right slide panels 216, 217; a chassis cover 218 with alignment pins 220–221; a circuit board 222 with a high reliability drive connector 224, wire harness connector 225, power connector (not shown) and SCSI interface connector (not shown); and rear cover 226 with openings 228–229 for the power and SCSI interface connectors, respectively, can be mounted within the peripheral module 104 on a shock absorbing suspension as described below with the rear cover 226 towards the back plate 140 of the peripheral module. A locking mechanism 232 comprising a lock 234, an LED 236, and a SCSI selector switch 238 enclosed within a face plate 240, lock plate 242, nut plate 246, and cover plates 248, 249, is mounted to the right slide plate 217 and chassis cover 218.

A full height, 3½ inch profile Winchester type fixed disk 252 is housed in top and bottom disk enclosures 254, 255 which are mounted using shock mount adapters 256, 257 with studs 258–259, elastic grommets 260–263 and shoulder nuts 264–267 to a U-shaped plate 268 of a removable disk housing 270. A circuit board 274 with a connector 276 that mates with the connector 224 of the docking mechanism 214 is float mounted on studs 278 on the U-shaped plate 268 and electrically connected to the fixed disk 252 with cables (not shown). A face plate 282, camming handle 284 are mounted to a forward end of the U-shaped plate 268. Parallel rails 286–289 are mounted to the U-shaped plate 268 on either side of the U-shaped plate. To install the removable disk housing 270 in the docking mechanism, the rails 286–289 are engaged in slots 292–293 in the slide plates 216, 217 and the removable disk housing slid into the docking mechanism until the connector 276 mates with the connector 224. Cam arms 296, 297 on the camming handle 284 engage in matching recesses 298, 299 in the slide plates 216, 217 to securely seat the removable housing. The removable housing is unseated by lifting the camming handle.

It is to be recognized that other removable mass storage devices, including devices employing other technologies, may be used without departing from the principles of the invention.

Referring again to FIG. 6, the peripheral device 126 is completely enclosed in the peripheral module 104. To access the device, the peripheral module 104 must be removed from the computer system 100 and its housing 130 disassembled. Since the peripheral device 126 is not externally accessible, it is desirably of a type that does not require external access. Peripheral devices that do not require external access include primarily fixed disk drive devices. For example, the peripheral device 126 is preferably a Winchester type fixed disk drive (similar to those 40, 252 previously described) comprising a fixed disk in a sealed housing, and electronic control and drive circuitry.

Referring to FIGS. 6 and 13–17, each of the peripheral devices 126, 128 are preferably mounted in shock and vibration absorbing suspension systems. The peripheral device 126 is mounted on a shock and vibration absorbing suspension system comprising adapter plates 314, 315, a mounting bracket 316, elastic grommets 318–321, and shoulder nuts 322–325. The adapter plates 314, 315 have two holes 326 for mounting the plates to the peripheral device 126 with threaded fasteners (not shown). The adapter plates 314, 315 also have two threaded studs 328 which extend outwardly from the peripheral device when the adapter is mounted on the device.

The mounting bracket 316 is mounted to the base plate 132 with threaded fasteners 330 in holes 331. The adapter plates 314, 315 are attached to the mounting bracket 316 by placing the elastic grommets 318–321 around the studs 328 on the adapter plates 314, 315, inserting the studs through holes 334 in the mounting bracket, and engaging the studs 328 with the shoulder nuts 322–325. The peripheral device 128 is similarly mounted to the base plate on two mounting brackets 340, 341 with adapter plates (not shown), elastic grommets and shoulder nuts.

Figure 8:
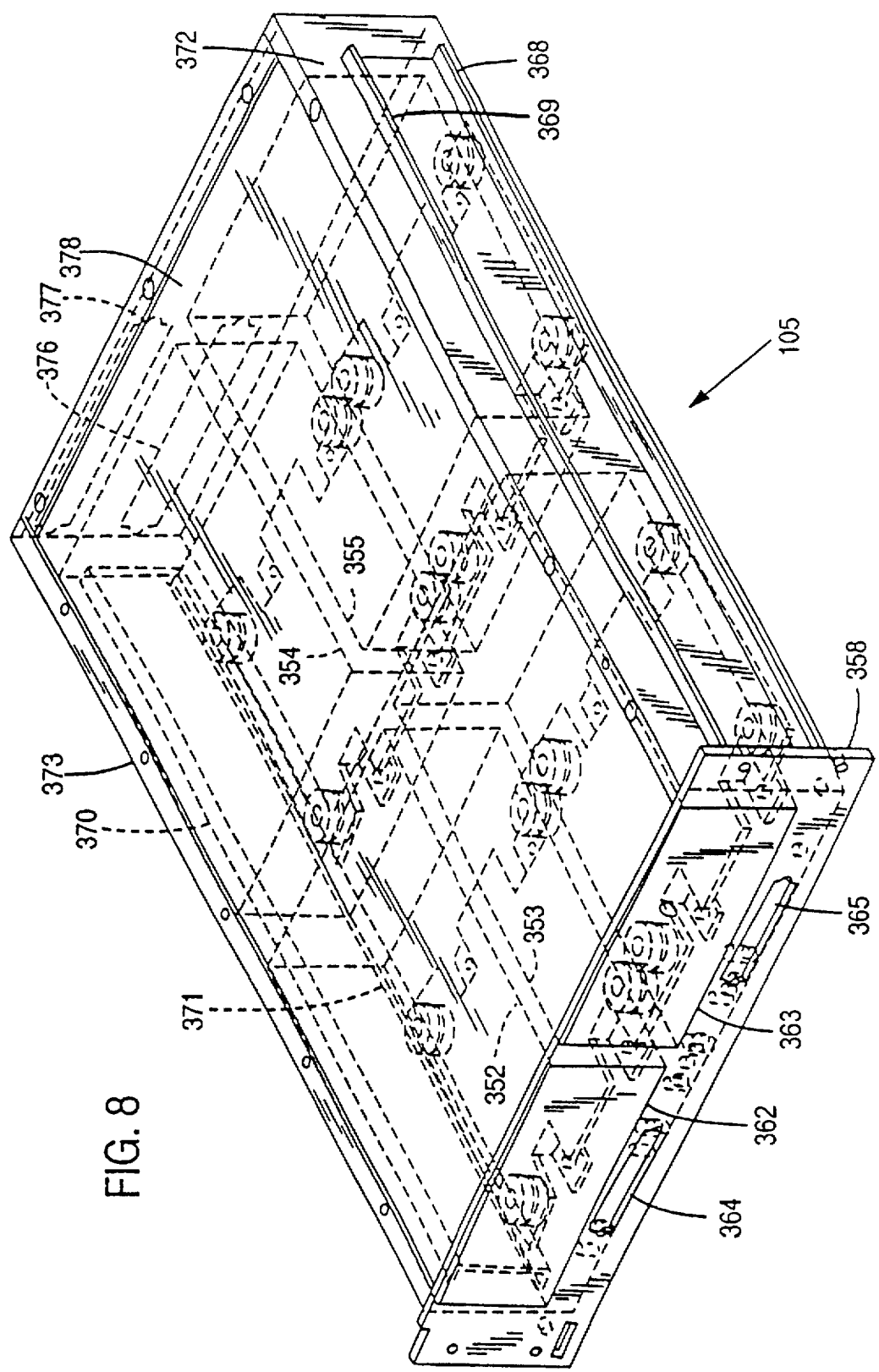
FIG. 8 is a diagram showing a perspective view of a third of the peripheral modules in FIG. 5.

With reference to FIG. 8, the peripheral module 105 is configured for four peripheral devices 352–355 having standard, full height 3½ inch width dimensions. A front panel 358 of the module 105 has two rectangular openings 362, 363 providing external access to the peripheral devices 352, 353, respectively. Two SCSI peripheral interface ports 360–361 (FIG. 5) of the same type as the ports 170–172 shown in FIG. 10 are provided in suitably shaped openings 364, 365 in the front panel 358 and connected in daisy chain fashion to the peripheral devices 352–355. The peripheral devices are mounted in shock and vibration absorbing suspension systems. It is to be recognized, however, that the devices can be hard mounted without departing from the principles of the invention. Two pairs of elongated, outwardly extending flanges 368–371 are provided on side panels 372–373 for slidingly engaging two adjacent pairs of vertically opposed card slots 116 in the chassis 102. Two connectors of the same type as the connector 156 are provided in rectangular openings 376–377 in a back plate 378 for engaging adjacent bus receptacles in the chassis 102.

Referring again to FIG. 5, the peripheral interface ports 202–203, 170–172, 360–361 on the front panels of the peripheral modules 103–105 provide the capability of connecting to another module such as the system bus controller module 108 for inter-module communication. The peripheral module 103 is shown in FIG. 5 with its SCSI peripheral interface port 202 connected to a SCSI interface port 288 on the system bus controller module 108 with a cable 290. The peripheral interface port 203 of the peripheral module 103 is shown connected to the peripheral interface port 170 on the peripheral module 104 with a cable 294. The peripheral interface port 172 of the peripheral module 104 is shown connected to the peripheral interface port 361 on the peripheral module 105 with a cable 295.

Figure 18:
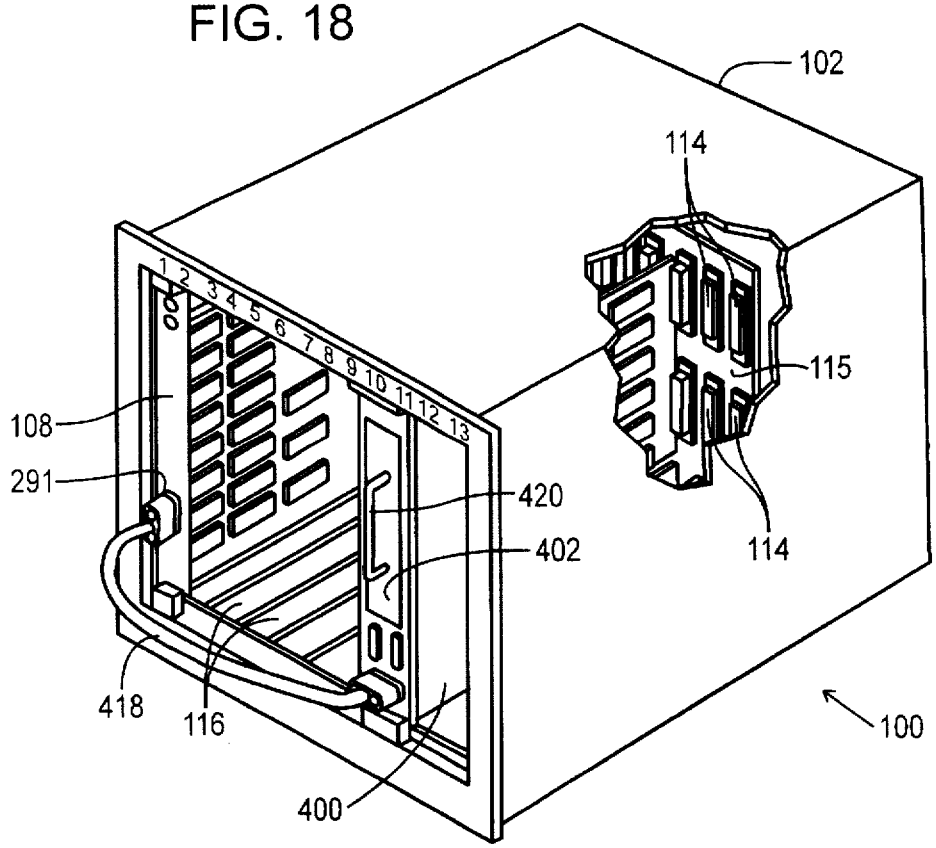
FIG. 18 is a perspective view, partly cut-away, of an open computer system with an externally accessible bus and a flat panel display module having a slide-out display panel in a vertical storage configuration according to another embodiment of the invention.
Figure 19:
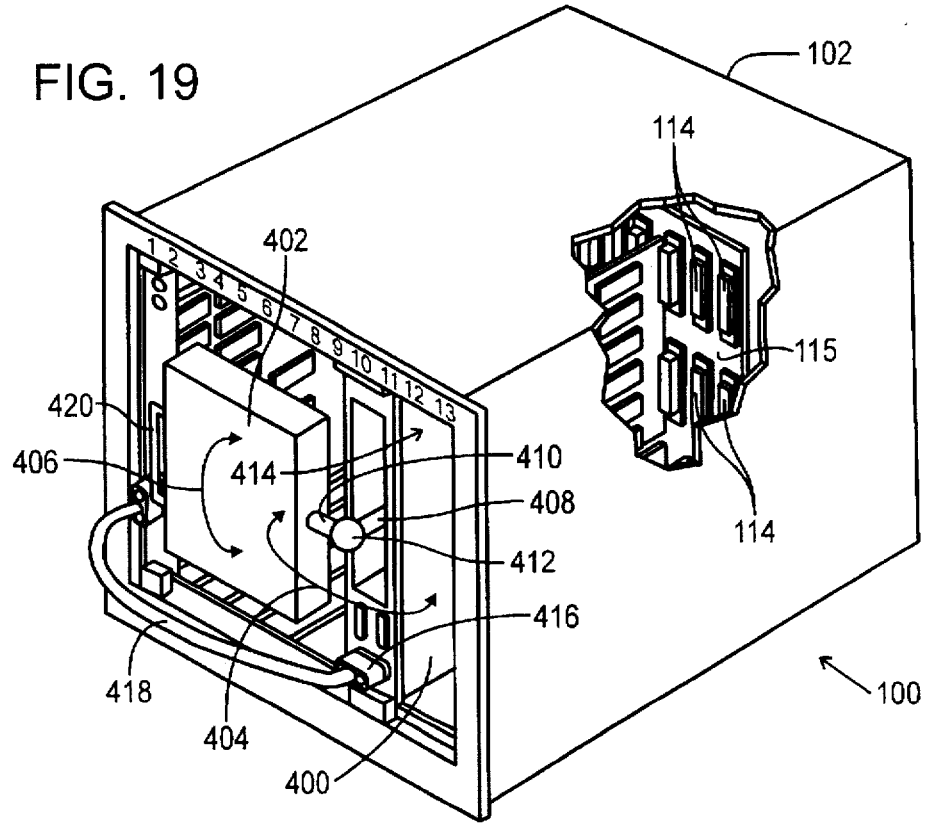
FIG. 19 is a perspective view of the computer system of FIG. 18, with the display panel of the display module in a display configuration.

Referring now to FIGS. 18 and 19, another embodiment of the invention provides a storable flat panel display module 400 that plugs into a peripheral slot of an open computer system 100. The flat panel display 402 may either be stored in a vertical configuration, as shown in FIG. 18, or pulled out and folded left, as shown in FIG. 19, or right, over other computer modules for use, as indicated by the double direction arrow 404. Once pulled out and folded over, the display may also be tilted up or down about a horizontal axis, as indicated by the double direction arrow 406. The display itself may be constructed of any of several well known technologies, such as liquid crystal displays, plasma displays and electroluminescent displays. It is to be recognized that other display technologies, including other flat panel display technologies, can be used without departing from the principles of the invention.

While any of a variety of well known mechanical support systems might be used to support the flat panel display without departing from the principles of the invention, the embodiment in FIGS. 18 and 19 employs an exemplary support system comprising a first extensible arm 408, a second arm 410 and a dual pivot joint 412. The extensible arm 408 enables the display panel to slide into or out of slot 414 in module 400. The dual pivot joint 412 permits the display panel to pivot about a vertical axis so that it can be folded either left or right, and to pivot about a horizontal axis so that it can be tilted up or down, for optimal viewing. When the panel is folded either left or right, it is disposed in front of other modules, but those other modules typically do not need regular access. Preferably, a handle 420 is provided for manipulating the display panel.

As described above, the display module may be electrically interconnected with the module 108, or other modules, either by front panel connectors 416 and a cable 418, by the backplane 115, or both.

Figure 20:
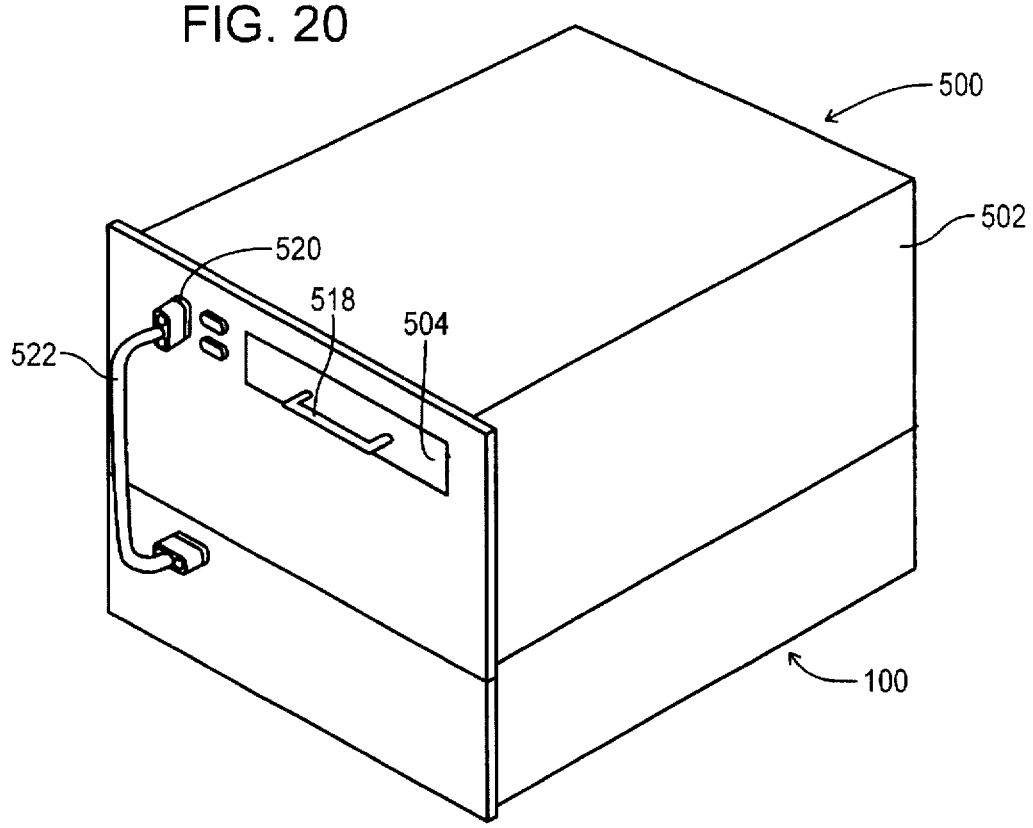
FIG. 20 is a perspective view of a flat panel display panel accessory to an open computer system, together with such an open computer system, having a slide-out display panel in a horizontal storage configuration according to another embodiment of the invention.
Figure 21:
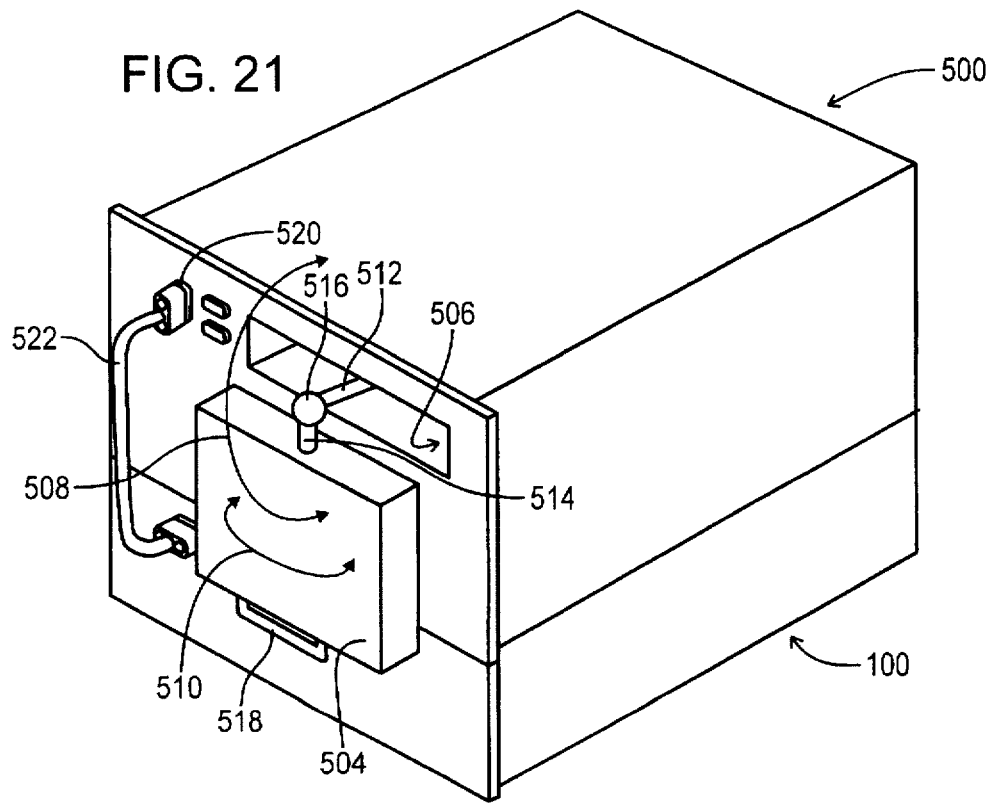
FIG. 21 is a perspective view of the flat panel display accessory of FIG. 20, with the display panel in a display configuration.

Turning now to FIGS. 20 and 21, one embodiment of a display accessory 500 according to the present invention comprises a rack mount enclosure 502 and a flat panel display 504. The display 504 slides into and out of a horizontal storage slot 506. When the display 504 is pulled out of the storage slot 506, it may be folded up or down about a horizontal axis, as indicated by double arrow 508, or rotated back and forth about a vertical axis as indicated by double arrow 510 for optimal viewing.

Like the display module embodiment of FIGS. 18 and 19, the display 504 of the accessory 502 is provided with an exemplary support structure comprising a first extensible arm 512, a second arm 514 and a dual pivot joint 516. It is also provided with a handle 518 for manipulating the flat panel display.

The display accessory of FIGS. 20 and 21 may be electrically connected to the computer 100, and other devices, by front panel connectors 520 and cable 522. It may also be connected by similar back panel connectors and cables, not shown.

Figure 22:
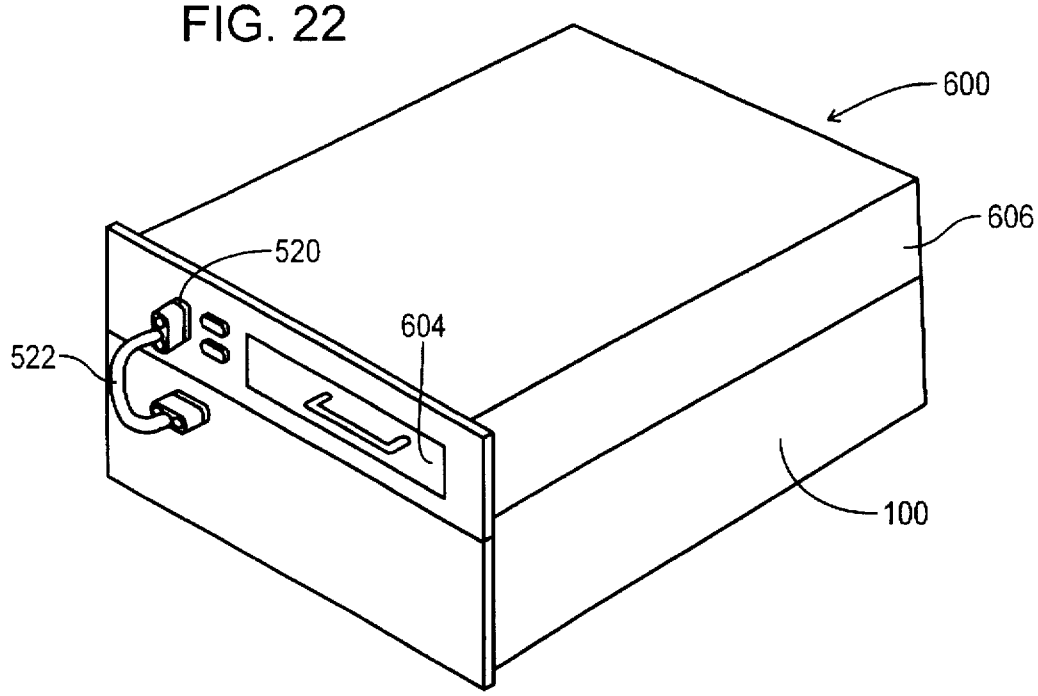
FIG. 22 is a perspective view of a flat panel display panel accessory to an open computer system, together with such an open computer system, having a pop-up display panel in a horizontal storage configuration according to another embodiment of the invention.
Figure 23:
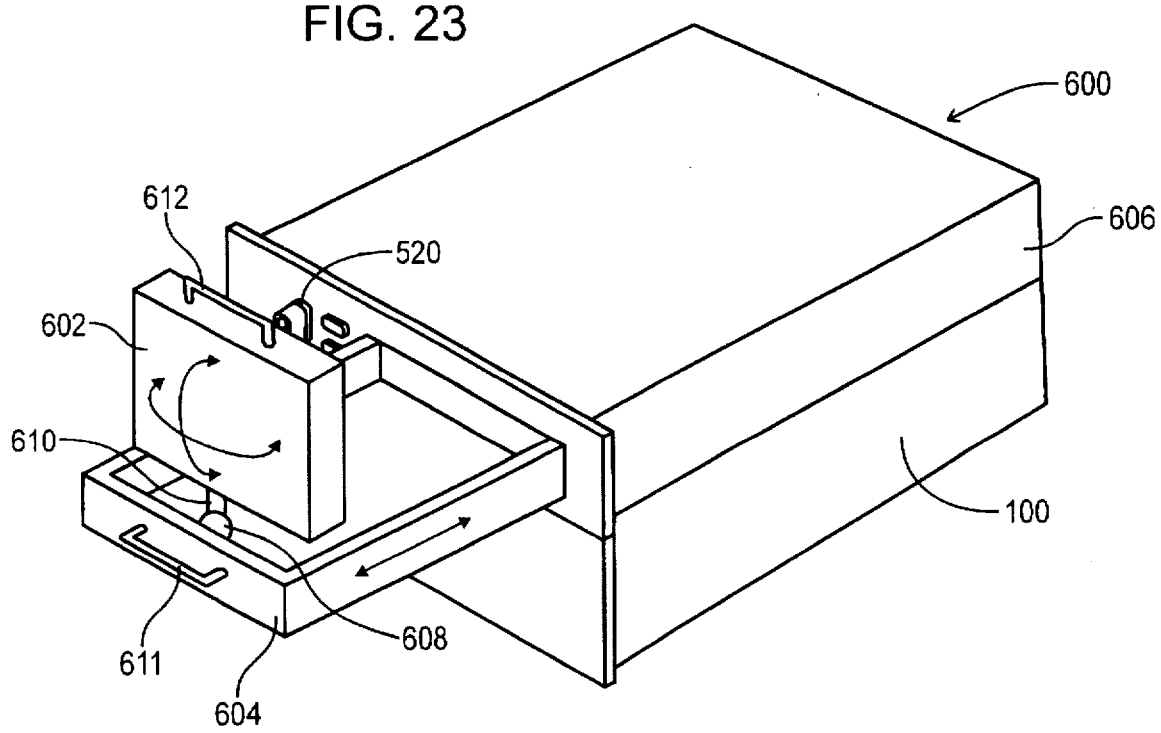
FIG. 23 is a perspective view of the front panel display accessory of FIG. 22, with the display panel in a display configuration.

FIGS. 22 and 23 show another embodiment of a flat panel display accessory 600. This embodiment is particularly similar to the embodiment of FIGS. 20 and 21, except that, in this case, the flat panel display 602 is disposed in a drawer 604 which is slidably mounted in a rack mounted enclosure 606. When the drawer is pulled out, the display 602 can pop up out of the drawer, as shown in FIG. 23. An exemplary support mechanism comprises a dual pivot joint 608 and a support arm 610. This support mechanism enables the display to pop up and to be rotated about a vertical axis and a horizontal axis, for optimal viewing. A handle 611 is provided for sliding the drawer 604 in and out, an a handle 612 is provided for manipulating the display.

Figure 24:
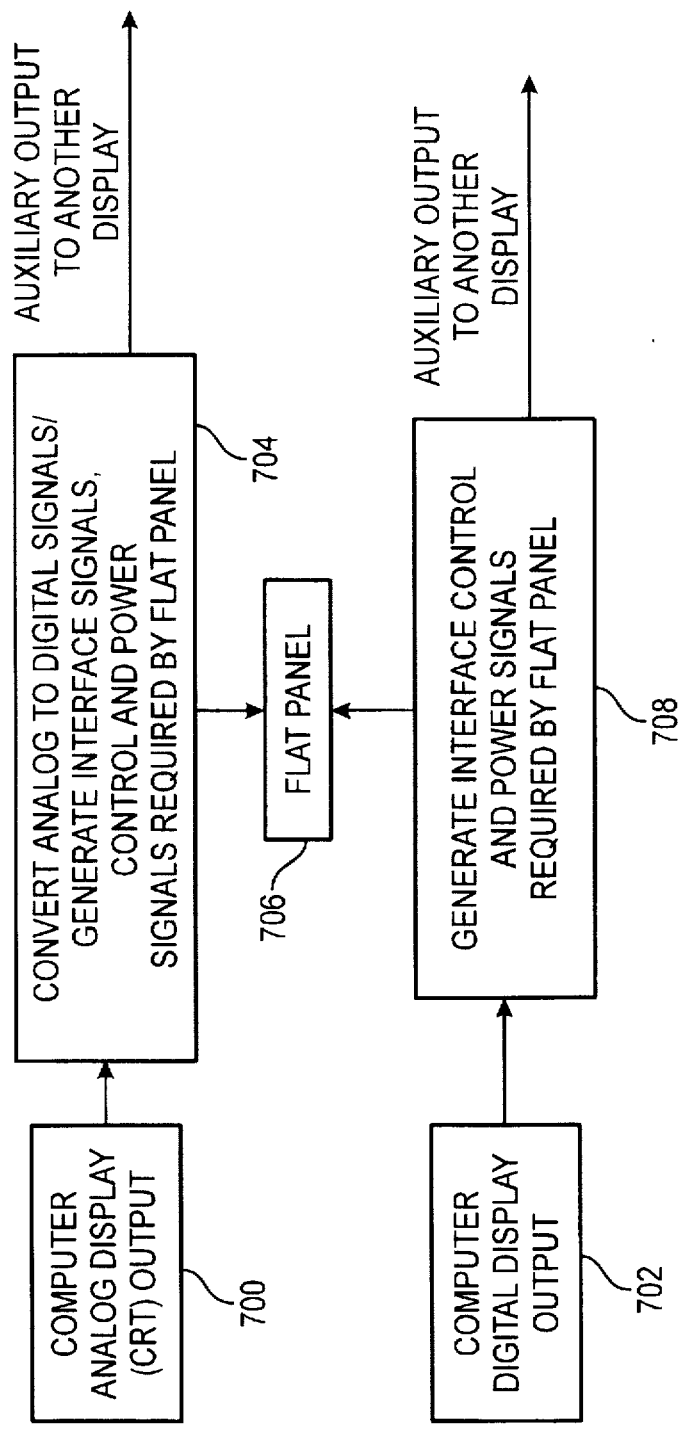
FIG. 24 is a block diagram of a flat panel display interface for the display panels of FIGS. 18 through 23.

FIG. 24 shows in block diagram form the preferred electrical relationships between the flat panel display of any of FIGS. 18 through 23 and the computer with which it is associated. Such a computer typically provides either an analog display output 700, a digital display output 702, or both. Where the computer provides an analog display output 700, the flat panel display module or accessory provides the power for the flat panel display, converts the analog signal a digital signal and generates the interface signals required by the flat panel display 706, as shown by block 704. Where the computer provides a digital display output, as shown by block 702, the flat panel display module or accessory provides the power and generates the interface signals, as shown by block 708.

Figure 25:
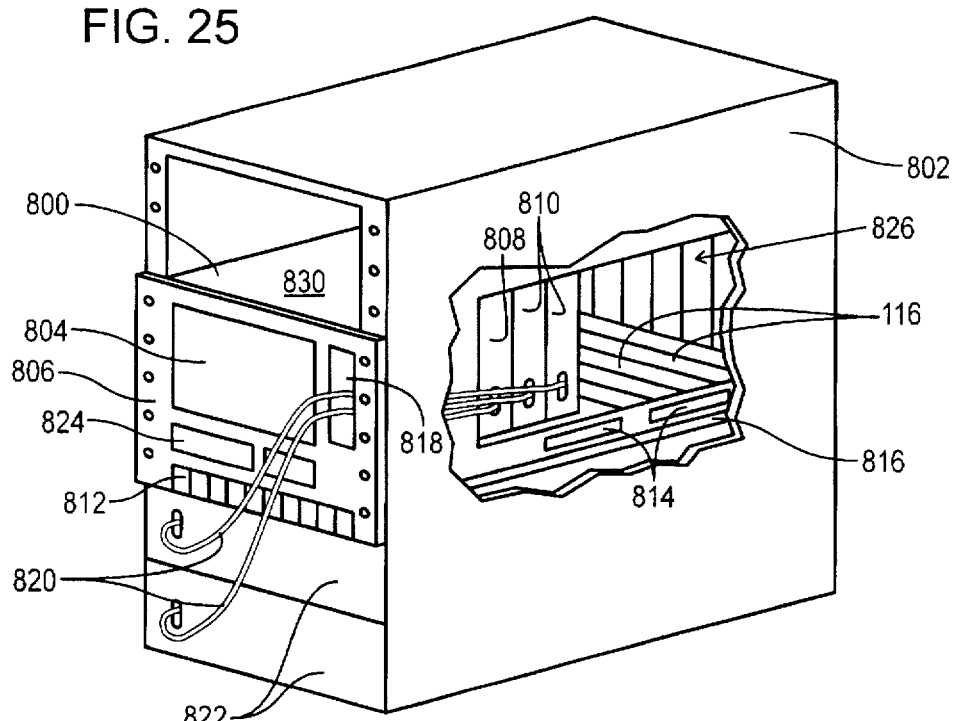
FIG. 25 is a perspective view of a computer housing having an opening along one side for receiving computer and other device modules, and a display integrated into another side, mounted in an equipment enclosure so that the display is at the front of the enclosure.
Figure 26:
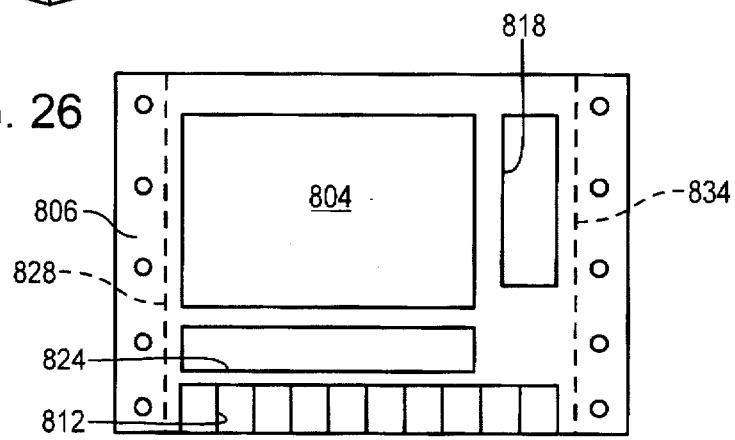
FIG. 26 is an elevation of the side of the computer housing of FIG. 25 having the display integrated therein, mounted in an equipment enclosure.
Figure 27:
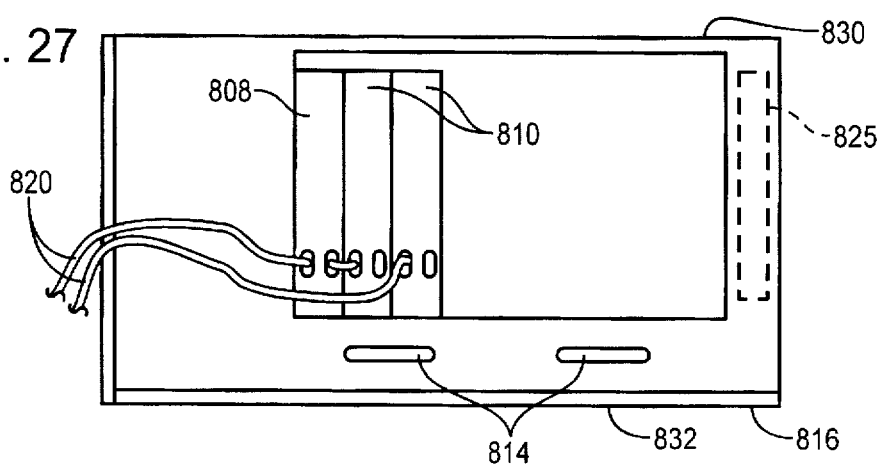
FIG. 27 is an elevation of the side of the computer housing of FIG. 25 having an opening for receiving computer and other device modules, mounted in an equipment enclosure.

Another embodiment of the invention is shown in FIGS. 25 through 27, wherein a computer housing 800 is adapted to be mounted in an equipment enclosure 802 at an orientation 90 degrees horizontally from the customary orientation, and has a display 804 disposed within the side 806 of the housing 800 which faces out of the enclosure 802. That is, while computer housings are customarily adapted to be mounted in an equipment enclosure so that an opening for receiving computer and other device modules faces out of the equipment enclosure, in this embodiment the opening 826 for receiving a computer module 808 and other device modules 810 faces 90 degrees from the front of the equipment enclosure 802. Preferably, the housing 800 of this embodiment is mounted within the equipment enclosure 802 using one or more slide mechanisms 816 so that the housing 800 can slide into or out of the enclosure 802 to conveniently insert modules into and remove modules from the housing 800.

The display 804 preferably comprises a flat panel display of the type discussed above, but may also comprise a CRT display where the depth of the housing 800 and the equipment enclosure 802 are great enough.

Preferably, the computer housing 800 also includes an air inlet/outlet 812, one or more fans 814 for forcing cooling air through the air inlet/outlet, a front aperture 818 for guiding interconnection cables, such as cables 820, through the side 806 to connect modules to other devices 822, and one or more front slots 824 for receiving modules, peripherals or other devices to be used with the computer. The slide mechanisms 816 may be any of a variety of well-known devices for use with drawers and the like. The housing 800 ordinarily would also include an integrated power supply 825 for providing power to the computer 808, modules 810, display 804 and other devices incorporated in or connected to the housing.

It is to be recognized that the opening 826 into which the computer 808 and other modules 810 are placed could be on the left side 828, the top side 830, or even the bottom side 832, as well as the right side 834, of the housing 800 without departing from the principles of the invention. It is also to be recognized that the housing 800 need not be limited to use with a computer, but that other types of electronic devices or systems, whether or not including a computer, could be employed with such housing without departing from the principles of the invention.

Those skilled in the art will appreciate that various adaptations and modifications of the just-described preferred embodiment can be configured without departing from the scope and spirit of the invention. For example, the peripheral modules of the present invention can be configured with various numbers and types of peripheral devices having standard or non-standard dimensions. Therefore, it is to be understood that, within the scope of the appended claims, the invention may be practiced other than as specifically described herein.

I claim:

1. In an open computer system comprising a chassis having a first side and an opposing second side, an aperture in the first side for receiving electronic modules, a bus disposed within the aperture at the second side for providing power to electronic modules, a plurality of bus receptacles disposed on the bus for connecting electronic modules to the bus, a plurality of guides disposed within the aperture for receiving electronic modules and aligning them with the receptacles, and a module having an intelligent controller and adapted to be installed within the aperture so as to present an interface port accessible from the first side of the chassis, a peripheral module, comprising;

a housing adapted for sliding engagement with one or more guides and having a module connector for engaging a receptacle, whereby said peripheral module is repeatably installable in and removable from the chassis;

a peripheral device disposed within said housing, said peripheral device including electronic circuitry, said electronic circuitry being electrically connected to said module connector for receiving power from a receptacle;

a front panel which is accessible from the first side of the chassis when said peripheral module is installed in the chassis; and an interface port located on said front panel, said interface port being electrically connected to said electronic circuitry of said peripheral device whereby said peripheral module is externally connectable to the interface port of the intelligent controller so as to communicate interface signals therebetween.

2. The peripheral module of claim 1, wherein said peripheral device comprises a mass storage device.

3. The peripheral module of claim 2, wherein said mass storage device comprises a rotatable fixed disk disposed in a sealed disk housing, said interface port being connected to circuitry for controlling operation of said disk.

4. The peripheral module of claim 1, further comprising at least one additional peripheral device disposed within said housing.

5. The peripheral module of claim 4, further comprising an additional interface port located on said front panel and connected internally to at least one of said peripheral devices disposed within said housing.

6. The peripheral module of claim 5, wherein said two interface ports are electrically interconnected within said peripheral module.

7. The peripheral module of claim 4, further comprising an additional interface port located on said front panel and connected internally to at least one of said peripheral devices disposed within said housing.

8. The peripheral module of claim 7, wherein said two interface ports are electrically interconnected within said peripheral module.

* * * * *